United States Patent [19]

Hartemann et al.

[11] 3,878,407

[45] Apr. 15, 1975

[54] SURFACE WAVE ELECTROMECHANICAL FILTER

[75] Inventors: Pierre Hartemann; Francel Genauzeau, both of Paris, France

[73] Assignee: Thomson-CSF, Paris, France

[22] Filed: Dec. 18, 1973

[21] Appl. No.: 425,792

[30] Foreign Application Priority Data

Dec. 22, 1972 France ............................. 72.45840

[52] U.S. Cl. ................. 310/8.1; 310/9.8; 333/30 R; 333/72

[51] Int. Cl. ................................................ H01v 7/00

[58] Field of Search ....................... 310/8.1, 9.7, 9.8; 333/30 R, 72

[56] References Cited

UNITED STATES PATENTS 3,548,306 12/1970 Whitehouse .................. 333/30 R X
3,626,309 12/1971 Knowles ........................ 333/30 R X
3,675,052 7/1972 Lindsey et al. ....................... 310/8.1
3,781,721 12/1973 Judd et al. ......................... 333/72 X
3,800,248 3/1974 Speiser et al. ................... 310/9.8 X

*Primary Examiner*—Mark O. Budd
*Attorney, Agent, or Firm*—Cushman, Darby & Cushman

[57] ABSTRACT

The present invention relates to elastic surface wave electromechanical filters utilising interdigitated transducers. The electromechanical filter in accordance with the invention is made of a piezoelectric substrate carrying on each of its opposite main faces a pair of side-by-side comb type transducers for forming two collateral transmission channels coupled to a balanced-unbalanced electrical transmission device.

10 Claims, 5 Drawing Figures

FIG. 1

SURFACE WAVE ELECTROMECHANICAL FILTER

The present invention relates to surface wave electromechanical filters, comprising a piezoelectric substrate upon which transducer networks constituted by interdigitated comb type electrodes, have been deposited. Under the effect of a signal applied to its electrodes, an interdigitated radiator element launches an elastic surface wave which propagates along a free face of the substrate towards another radiator element which picks it up and converts it into an electrical signal whose frequency spectrum is equal to the product of the spectrum of the incident signal and the transfer function of the electromechanical filter. The transfer function depends upon the configuration of the comb type transducers and upon the velocity of propagation of the surface waves. In the case of a narrow-band bandpass filter, it is necessary to utilise interdigital networks having a substantial length considered in the direction of propagation of the surface waves. In other words, the transfer function is determined by the Fourier transform of the pulse response of the filter and those skilled in the art will appreciate that the spectrum of said transform is the narrower the greater the duration of its envelope. The result is, that, taking into account the propagation velocity imposed, the pulse response has a broader time base, the longer the transducer networks which are used.

It will be seen, therefore, that the size of a surface wave electromechanical filter increases with the selectivity and with the transmission velocity employed which latter depends upon the choice of substrate and the mode of propagation of the surface waves.

The problem of the size of surface wave electromechanical filters does not arise solely in the case where the comb structures have uniformly spaced fingers, but also in the case where a non-uniform spacing is adopted in order to achieve filters with dispersive characteristics designed to effect compression of frequency modulated pulses, and more generally to effect tuned filtering of electrical signals. In dispersive delay systems, the accuracy with which the compression law is obeyed, depends upon the number of interdigital spaces provided in each transducer comb. The compression ratio is associated with the longitudinal size of the transducer combs. Accordingly, there it is a dispersive structure having a high compression ratio which is to be produced, using a substrate having a high propagation velocity, then necessarily a relatively substantial size is the result and a proportionally high cost price.

These drawbacks are a particular nuisance where long pulses are being compressed or where the frequency band transmitted is very narrow.

The object of the present invention is to overcome these drawbacks by a more effective utilisation of the external surface of the piezoelectric substrate which carries the transmitting and receiving transducer networks. The piezoelectric substrate has a generally flattened cylindrical surface in order to delimit two opposite faces which respectively carry the transmitter and receiver transducer networks. The filter length is thus reduced by half, for the same characteristics, but the proximity between the two transducer networks give rise to undesirable electrostatic coupling. To avoid this drawback, the invention provides for each comb network to be split and for one of the split networks to be associated with an unbalanced-balanced electrical circuit which makes it possible to eliminate the parasitic signals resulting from said unwanted electrostatic coupling.

In accordance with the present invention, there is provided a surface wave electro-mechanical filter comprising: a piezoelectric substrate having two main faces facing one another, first and second interdigitated transducer means arranged on one of said main faces for forming a pair of collateral radiator elements, third and fourth interdigitated transducer means arranged on the other one of said main faces for forming a pair of further collateral radiator elements, at least one curved face linking with one another said main faces, first electrical connecting means for parallel connection of said collateral radiator elements with one terminal pair of said filter, and balanced-unbalanced transmission electrical means for connecting the other terminal pair of said filter to the respective terminals of said further collateral radiator element.

For a better understanding of the present invention, and to show how the same may be carried into effect, reference will be made to the ensuing description and the attached figures among which:

Surface wave electromechanical filters are constituted by comb shaped interdigital electrodes which, connected to an alternating voltage source, are capable of inducing in an underlying piezoelectric material a electric field distribution which gives rise to elastic surface waves such as Rayleigh waves and Bleustein waves. The launching of these surface waves is a directive process because the radiator elements located in line with the interdigital spaces between the electrodes, have a substantial width in relation to the wavelength of the vibrations transmitted at the surface of the piezoelectric material. In practice, on one and the same face of a piezoelectric substrate, two successive interdigitated transducers are arranged, one to launch the surface waves, and the second to receive them in extension of the first. The longitudinal size of the substrate, is then at least equal to the sum of the respective lengths of the input and output transducers.

Figure 1:
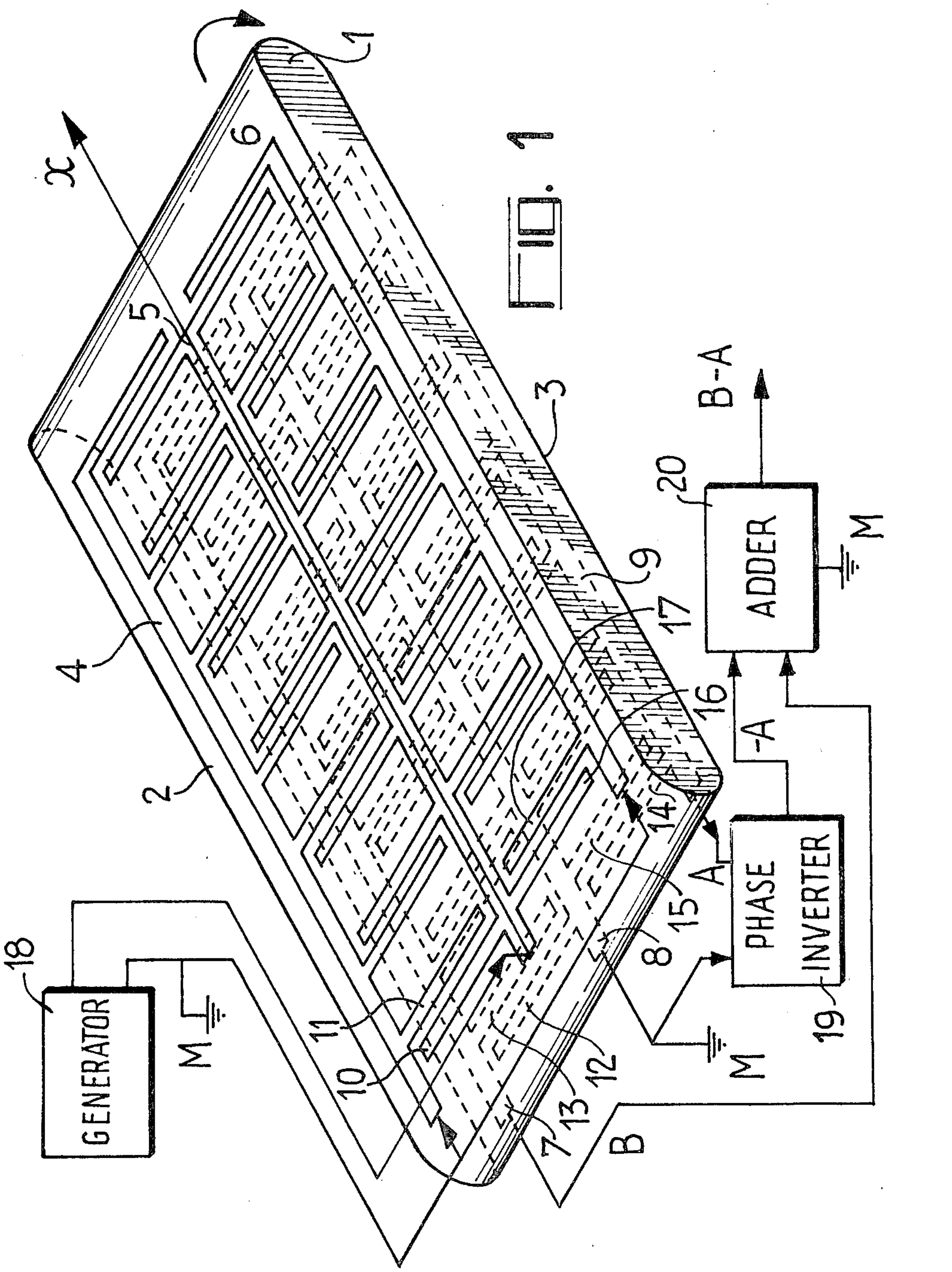
FIG. 1 is an isometric view of a first embodiment of the device in accordance with the invention.

In FIG. 1, a first example of a surface wave electromechanical filter having a longitudinal size which has been reduced by half, can be seen. This filter comprises a piezoelectric substrate 1 of flattened cylindrical form, which may be example comprise a flat top face 2 and a flat bottom face 3, these main faces being connected together at each end through circular cylindrical further faces.

The top face 2 of the substrate carries three electrode arrays which are electrically isolated from one another, respectively in fact:

a first comb structure 4 with a single set of teeth 11, a second comb structure 5 with double sets of teeth 10 and 16, and a third comb structure 6 with a single set of teeth 17. These three electrodes constitute two side-by-side networks of interdigital comb structures which, in association with the substrate 1, are capable of emitting at either side of the axis $x$, elastic surface waves when excited by means of an alternating generator 18. The external comb structures 4 and 6 being taken to the earth M of the generator 18, and the centre comb structure 5 connected to the other generator terminal, it will be appreciated from the manner in which the teeth are staggered, that the two side-by-side transducer arrays will emit co-phasal surface waves both in the positive direction of the axis *x* and in the negative direction. These surface waves propagate in a parallel way, moving away from the centre of the top face 2, and after passing round the rounded end faces of the substrate 1, will encounter one another on the bottom face 3 of the substrate.

The bottom face 3 likewise carries three electrodes, over an appreciable part of its length, which are constituted respectively by the single comb 7, 13, the double comb 8, 12 and 15 and the single comb 9, 14. These comb structures, shown in broken line in FIG. 1, are located straight beneath the comb structures on the top face of the substrate; the same applies to the common edges and the fingers, but the electrical connections are not effected in this way.

From a consideration of FIG. 1, it will be seen that following the cylindrical surface of the substrate in accordance with the curved arrow, the teeth of the double comb structures 5 and 8 lead those of the single comb structures 6 and 9; by contrast, if we consider the single comb structures 4 and 7, at the top, the teeth of the double comb 5 lead those of the comb 4, whilst underneath, the teeth of the double comb 8 lag those of the comb 7. This reversal in the order of succession of the teeth in the transducer network 7, 8 located at the rear on the bottom face of the substrate, explains why the voltages A and B induced in the networks 7, 8 and 8, 9 by the surface waves respectively coming from the networks 4, 5 and 5, 6, are equal but of opposite sign.

For the effects of the induced voltages to be additive, the electrode 8 has been taken to the earth M and the voltages A and B are picked up by a balanced-unbalanced electrical connecting device. This electrical connecting device is constituted for example by a phase inverter circuit 19 producing a voltage -A which is subsequently added to the voltage B in an adder circuit 20. The voltage B - A produced by the adder 20, is double the voltages A or B which are produced by the two side-by-side transducer networks arranged upon the bottom surface of the substrate.

The need to sub-divide the transmitting and receiving transducer networks for the surface waves, arises from the existence of a substantial electrostatic coupling between the electrodes located upon the face 2 and 3 of the substrate.

Figure 3:
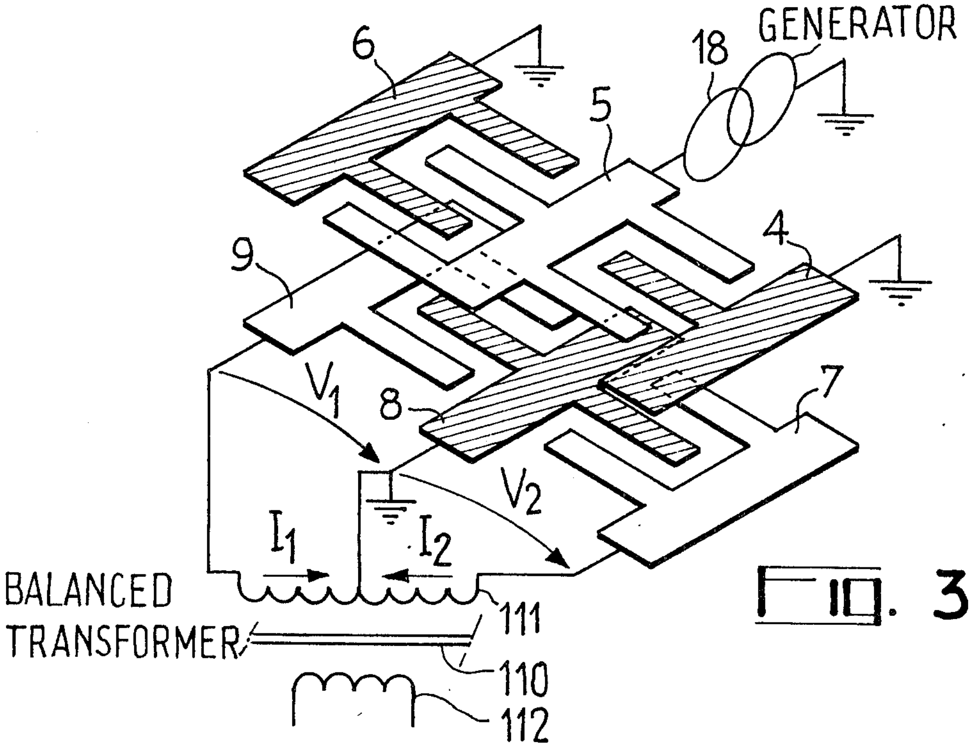
FIG. 3 is an explanatory figure.

Considering FIG. 3, a fragment of the electrode system of FIG. 1 has been shown, omitting the piezoelectric substrate. The electrodes 4, 6 and 8 are earthed and in order to distinguish them better they have been cross-hatched. The electrodes 5, 7 and 9 which have not been cross-hatched, are electrostatically coupled since the substrate is an essentially dielectric material which has no electrostatic screening effect between the electrode 5 and the respective electrodes 7 and 9.

Considering FIG. 3, it will be seen that the balanced-unbalanced electrical connecting device may be constituted by a transformer 110 having a primary 111 with an earthed centre-tap, and a secondary 112. Due to the parasitic capacitances existing between the electrode 5 and the electrodes 7 and 9, the alternating generator 18 results in the circulation through the primary 111 of the transformer of currents $I_1$ and $I_2$ which are equal in magnitude and flow towards the centre tap. The magnetomotive force resulting from these capacitive currents, is zero and no voltage is induced in the secondary 112 under the influence of these currents. By contrast, the voltages $V_1$ and $V_2$ of opposite signs, which are induced by piezoelectric effect under the influence of the surface waves, are additive and result in the appeareance of an induced voltage across the terminals of the secondary 112.

It will be seen, therefore, that by the use of two side-by-side transducer networks on each face of the substrate, with a balanced-unbalanced connection, it is possible to completely neutralise the electrostatic coupling without affecting transmission of the useful signals. The transformer 110 shown in FIG. 3, is connected to the output terminals of the electromechanical filter, but it could equally well be used to supply the transmitting transducer networks, in another version of the same circuit. It should also be noted that the transformer 110 can be replaced by an electrical bridge circuit or by a two-input differential amplifier.

In the foregoing, we have seen that the surface waves are emitted both in the positive direction of the axis *x* and in the negative direction thereof, It is conceivable that the device shown in FIG. 1 could be constructed to be strictly symmetrical vis-a-vis a plane perpendicular to the axis *x;* in this case, there would be no reason not to allow the surface waves to propagate to the bottom face of the substrate, via its two rounded end faces. However, this solution would give rise to multiple signals and to standing waves. To overcome these drawbacks, the invention provides for the inhibition of one direction of propagation on the part of the surface waves, by applying to one of the rounded end faces of the substrate, a strip of absorbent material.

This strip or band can be constituted by a piece of adhesive tape produced from a plastic film; the tape is applied to one of the rounded end faces of the substrate, in order to dissipate the vibrational energy of the surface waves.

The device shown in FIG. 1 makes use of a central electrode 5 or 8 of comb design, with a double set of teeth. Without departing from the scope of the invention, it may be assumed that this electrode is intersected centrally by the axis x in order to form on each face of the substrate, two completely separated transducer networks. The substrate itself could be split into two parts by a plane of section containing the axis ox, in order to create two electromechanical structures which, operated together, would provide the same advantages. It is not indispensable, moreover, that the two transducer networks associated with each face of the substrate, should radiate in parallel directions in the manner shown in FIG. 1.

The precise suppression of the parasitic signals resulting from capacitive coupling, may require an adjustment which can be effected by adjusting the gains of the two differential channels to which the signals produced by the filter are applied. It is equally possible to effect adjustment by the use of an auxiliary capacitance in one of the arms of the device, this capacitance being constituted for example by an extension of an electrode which is not earthed, which extension is reduced by scraping in order, in each device manufactured, to acheive the lowest parasitic signal factor.

In the device shown in FIG. 1, the transducer combs have been shown with a constant spacing since the filter in question is designed more particularly for the narrow-band filtering of electrical signals. By contrast, in the device shown in FIG. 2, a non-uniform spacing on the part of the transducer comb teeth has been adopted, in order to obtain a dispersive characteristic so that frequency modulated pulses can be compressed.

Figure 2:
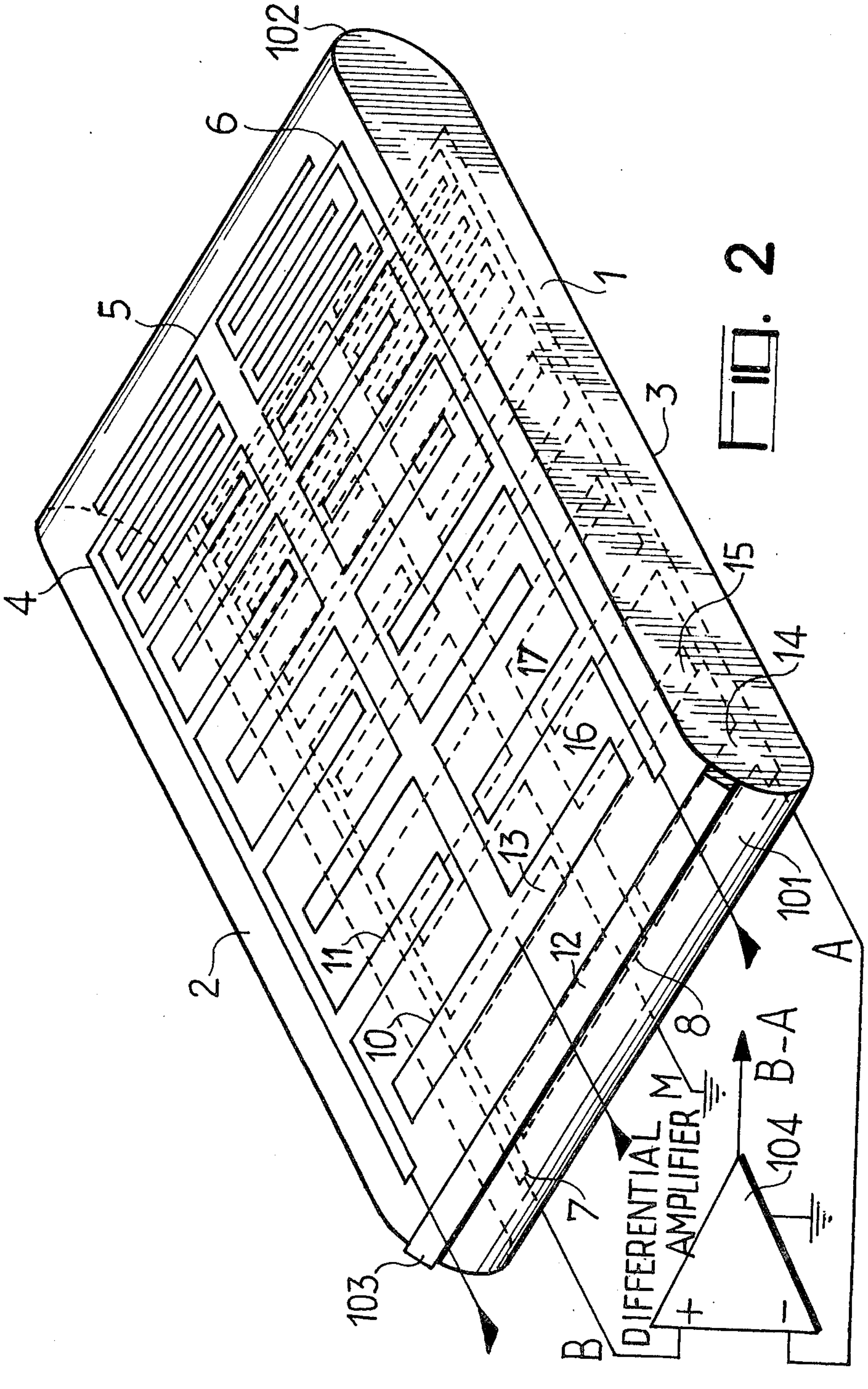
FIG. 2 is an isometric view of a second embodiment of a device in accordance with the invention.

The references used in FIG. 2 are those which have also been used in FIG. 1, except that the elements 19 and 20 have been replaced by differential amplifier 104; in this figure, the adhesive tape 103 can be seen which serves to absorb the surface waves travelling towards the end 101 of the substrate. The other rounded end face 102 is polished in order to transmit the surface waves without diffraction.

In the case of dispersive delay lines, the law of variation in the spacing of the teeth of the comb structures is not a matter of arbitrary choice. When a device such as that shown in FIG. 2 is being manufactured, the absorptive tape 103 can be attached either to the end face 101 or to the end face 102. Thus, there is a choice of two possible arrangements which have been respectively illustrated in elevation in FIGS. 4 and 5.

Figure 4:
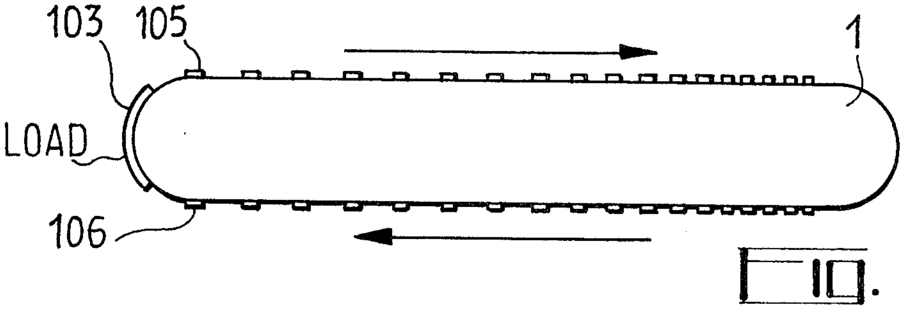
FIGS. 4 and 5 are elevational views of the device shown in FIG. 2.

In FIG. 4, the comb teeth 105 and 105 progressively close ranks working from left to right, and if we assume that the teeth 105 are those which belong to the transmitting networks then it will be seen that the positioning of the absorbent element 103 at the left, means that surface waves propagate solely in accordance with the direction of the arrows.

Figure 5:
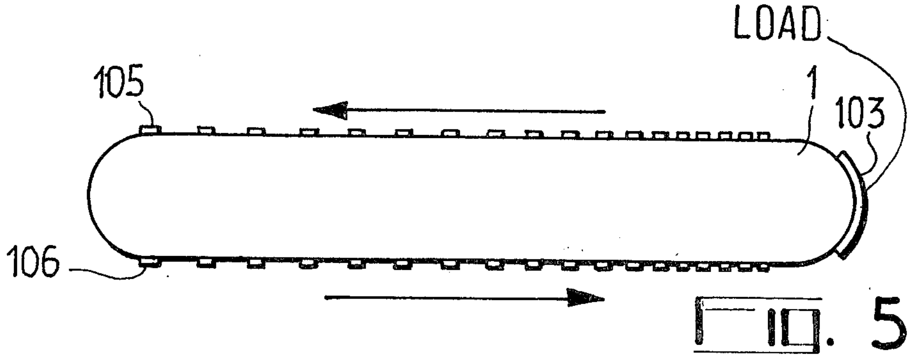

In FIG. 5, the reverse situation is obtained by placing the absorbent element 103 at the right. This option of choice of the sign of the slope of the dispersion characteristic, is an advantage which could not be exploited if the two transducers were assembled in a row on a single face of the substrate.

In closing, it should be pointed out that the gain in terms of size, achieved by etching the transducer networks in the two faces of a substrate, can advantageously be combined with that achieved by making the substrate of a material in which the surface waves propagate at a low velocity.

The materials best indicated for the manufacture of the substrate, considered in rising order to preference, are quartz, lithium niobate and bismuth germanate; this is due to the fact that this list orders the materials in terms of decreasing propagation velocity.

What we claim is:

1. A surface wave electromechanical filter having two terminal pairs and comprising: a piezoelectric substrate having two main faces facing one another, first and second interdigitated transducer means arranged on one of said main faces for forming a pair of collateral radiator elements, third and fourth interdigitated transducer means arranged on the other one of said main faces for forming a pair of further collateral radiator elements, at least one curved face linking with one another said main faces, first electrical connecting means for parallel connection of said collateral radiator elements with one of said terminal pairs, and balanced-unbalanced electrical connecting means for connecting the other of said terminal pairs to the respective terminals of said further collateral radiator elements.

2. A surface wave electromechanical filter as claimed, in claim 1, wherein means for absorbing said surface waves are provided on one of the surface portions of said substrate, linking with one another said main faces.

3. A surface wave electromechanical filter as claimed in claim 1, wherein said balanced-unbalanced electrical connecting means comprise a transformer having at least one centre-tapped winding.

4. A surface wave electromechanical filter as claimed in claim 1, wherein said balanced-unbalanced electrical connecting means comprise a differential amplifier having two pairs of terminals; voltages of equal magnitude and opposite sign appearing across said two pairs of terminals.

5. A surface wave electromechanical filter as claimed in claim 4, wherein the pairs of terminals of said differential amplifier are the input terminals of said amplifier.

6. A surface wave electromechanical filter as claimed in claim 1, wherein said balanced-unbalanced electrical connecting means comprise an adder circuit having two inputs and a phase inverter circuit connected to one of said inputs.

7. A surface wave electromechanical filter as claimed in claim 1, wherein said first and second interdigitated transducer means have a common electrode constituted by a comb structure with a double set of teeth, and two further electrodes with single sets of teeth, respectively arranged at each side of said common electrode.

8. A surface wave electromechanical filter as claimed in claim 1, wherein said interdigitated transducer means have uniformly spaced arrays of teeth.

9. A surface wave electromechanical filter as claimed in claim 1, wherein said interdigitated transducer means have non-uniformly spaced arrays of teeth.

10. A surface wave electromechanical filter as claimed in claim 1, wherein said piezoelectric substrate is constituted by a wafer of bismuth germanate.

* * * * *